(12) United States Patent
Aoi

(10) Patent No.: US 7,947,375 B2
(45) Date of Patent: May 24, 2011

(54) INTERLAYER DIELECTRIC FILM

(75) Inventor: Nobuo Aoi, Hyogo (JP)

(73) Assignee: Panasonic Corporation, Osaka (JP)

( * ) Notice: Subject to any disclaimer, the term of this patent is extended or adjusted under 35 U.S.C. 154(b) by 634 days.

(21) Appl. No.: 12/000,124

(22) Filed: Dec. 10, 2007

(65) Prior Publication Data
US 2008/0090094 A1   Apr. 17, 2008

Related U.S. Application Data

(62) Division of application No. 10/128,296, filed on Apr. 24, 2002, now abandoned.

(30) Foreign Application Priority Data

May 11, 2005   (JP) ................................. 2001-141055

(51) Int. Cl.
*B32B 9/04* (2006.01)
(52) U.S. Cl. ...................................................... 428/447
(58) Field of Classification Search ................... 428/447
See application file for complete search history.

(56) References Cited

U.S. PATENT DOCUMENTS

| | | | |
|---|---|---|---|
| 4,183,874 A | 1/1980 | Fan et al. | |
| 5,442,024 A | 8/1995 | Kunimune et al. | |
| 5,773,197 A | 6/1998 | Carter et al. | |
| 5,877,080 A | 3/1999 | Aoi et al. | |
| 5,962,113 A | 10/1999 | Brown et al. | |
| 6,171,687 B1 | 1/2001 | Leung et al. | |
| 6,465,368 B2 | 10/2002 | Inoue et al. | |
| 6,472,082 B2 | 10/2002 | Kodemura | |
| 7,144,827 B2 * | 12/2006 | Rantala et al. | 438/778 |
| 2002/0192980 A1 | 12/2002 | Hogle et al. | |
| 2003/0044588 A1 | 3/2003 | Komoto et al. | |
| 2003/0216058 A1 * | 11/2003 | Ko et al. | 438/781 |
| 2004/0068075 A1 | 4/2004 | Lichtenhan et al. | |
| 2004/0202874 A1 * | 10/2004 | Iwabuchi et al. | 428/447 |

FOREIGN PATENT DOCUMENTS

| | | |
|---|---|---|
| EP | 0 150 403 | 8/1985 |
| JP | 60-142545 | 7/1985 |
| JP | 5-125191 | 5/1993 |
| JP | 8-124919 | 5/1996 |
| JP | 10-178006 | 6/1998 |
| JP | P2000-12532 A | 1/2000 |

OTHER PUBLICATIONS

Morikawa et al., "Preparation of a New Class of Polimide-Silica Films by Sol-Gel Process", Polymer Journal, vol. 24 No. 1, pp. 107-113 (1992).
Homma et al. "Stability of a new polyimide siloxane film as interlayer dielectrics of ULSI multilevel Interconnections", Thin Solid Films, 235 (1993) pp. 80-85.
Excerpt from Webster,s Dictionary, p. 1172, 1998.

* cited by examiner

*Primary Examiner* — Margaret G Moore
(74) *Attorney, Agent, or Firm* — McDermott Will & Emery LLP

(57) ABSTRACT

An interlayer dielectric film is made from an organic/inorganic hybrid film. The organic/inorganic hybrid film has a main chain in which a first site of siloxane and a second site of an organic molecule are alternately bonded to each other.

16 Claims, 13 Drawing Sheets hydrolysis dehydration condensation

US 7,947,375 B2

INTERLAYER DIELECTRIC FILM

RELATED APPLICATIONS

This application is a Divisional of U.S. application Ser. No. 10/128,296, filed Apr. 24, 2002, and now abandoned claiming priority of Japanese Patent Application No. 2001-141055, filed May 11, 2001, the entire contents of each of which is hereby incorporated by reference.

BACKGROUND OF THE INVENTION

The present invention relates to an interlayer dielectric film with a low dielectric constant capable of preventing diffusion of copper, that is, a material for interconnects.

In an interlayer dielectric film of a VLSI, reduction of design rule has led to a problem of increase of parasitic capacitance between adjacent interconnects, and it is significant to lower the dielectric constant of the interlayer dielectric film in order to reduce the parasitic capacitance between interconnects.

As a low dielectric interlayer dielectric film, a siloxane film, such as a methylsilsesquioxane (MSQ) film (with a dielectric constant of approximately 2.9) and a hydrogenated silsesquioxane (HSQ) film (with a dielectric constant of approximately 3.0), including $SiO_2$ as a principal constituent has been proposed. FIG. 14 shows the chemical structure of methylsilsesquioxane, that is, an example of conventional organic siloxane in which an organic group is bonded to siloxane. In FIG. 14, a methyl group is bonded to a Si atom included in the main chain of the siloxane.

Alternatively, an organic polymer film including an aromatic compound polymer, such as a polyimide derivative, a polyalyl ether derivative, a polyquinoline derivative or a polyparaxylene derivative, having a low dielectric constant and high heat resistance has been proposed as the low dielectric interlayer dielectric film. Such an organic polymer film has a low dielectric constant because it includes carbon as a principal constituent, and hence, the polarizability of molecules included in the film is lower than that of a conventionally used interlayer dielectric film including $SiO_2$ as a principal constituent. Therefore, such an organic polymer film is regarded as a promising low dielectric interlayer dielectric film.

However, when copper is used as the material for interconnects, copper ions are diffused by an electric field or heat into such a low dielectric interlayer dielectric film. Therefore, the breakdown voltage of the interlayer dielectric film is disadvantageously lowered when it is used for a long period of time. When the breakdown voltage of the interlayer dielectric film is lowered, dielectric failure is caused, which may result in failure of the operation of the VLSI.

SUMMARY OF THE INVENTION

In consideration of the aforementioned conventional problem, an object of the invention is preventing copper used as the material for interconnects from diffusing into an interlayer dielectric film so as to prevent the breakdown voltage of the interlayer dielectric film from lowering over a long period of use.

The mechanism of the diffusion of copper into an interlayer dielectric film has not been completely solved. Probably, copper atoms included in the interconnect material are ionized to dissolve in the interlayer dielectric film, so that the copper ions dissolved in the interlayer dielectric film can drift in the interlayer dielectric film due to an electric field.

Also, the interlayer dielectric film attains a low dielectric constant by reducing the density of the interlayer dielectric film, for example, by making it porous. The mechanism of the drift of copper ions in an interlayer dielectric film with low density is different from that of the drift of copper ions in a conventional dense interlayer dielectric film. The interaction between molecules included in the interlayer dielectric film and copper ions is probably dominant in the interlayer dielectric film with low density. Specifically, the interaction between molecules included in a polymer film is smaller in the interlayer dielectric film with low density than in a dense interlayer dielectric film (that is, a bulk solid). Therefore, the degeneracy of electron orbitals between the molecules is solved, so that the molecules included in the polymer film can behave as if they were individual molecules also in the interlayer dielectric film. Furthermore, copper ions drift in the interlayer dielectric film dominantly through the interaction between the molecules and the copper ions. Accordingly, drift paths of the copper ions are along the surfaces of the molecules included in the interlayer dielectric film.

The present invention was devised on the basis of these findings and utilizes the interaction between copper ions and siloxane larger than that between copper ions and an organic molecule.

Specifically, the first interlayer dielectric film of the invention comprises an organic/inorganic hybrid film having a main chain in which a first site of siloxane and a second site of an organic molecule are alternately bonded to each other.

The second interlayer dielectric film of the invention comprises an organic/inorganic hybrid film composed of a plurality of first sites of siloxane and a plurality of second sites of an organic molecule, and the plurality of first sites are bonded to the plurality of second sites alone and the plurality of second sites are bonded to the plurality of first sites alone.

The third interlayer dielectric film of the invention comprises an organic/inorganic hybrid film composed of a plurality of first sites of siloxane and a plurality of second sites of an organic molecule, and each of the plurality of first sites is surrounded with the plurality of second sites.

The fourth interlayer dielectric film of the invention comprises an organic/inorganic hybrid film composed of a plurality of first sites of siloxane and a plurality of second sites of an organic molecule, and each of the plurality of second sites is surrounded with the plurality of first sites.

In any of the first through fourth interlayer dielectric films, the potential energy required for, namely, the barrier height to be cleared by, copper ions drifting in the organic/inorganic hybrid film from a copper film used as an interconnect material and moving along the main chain of the polymer included in the organic/inorganic hybrid film is much larger than the potential energy required for, namely, the barrier height to be cleared by, copper ions moving along the main chain of a polymer included in a conventional interlayer dielectric film. Therefore, the copper ions are easily trapped by the first sites of siloxane in the interlayer dielectric film. Accordingly, the copper ions are minimally diffused into the interlayer dielectric film. As a result, the breakdown voltage of the interlayer dielectric film of any of the first through fourth interlayer dielectric films is minimally lowered even when used for a long period of time.

In any of the first through fourth interlayer dielectric films, pores are preferably dispersed in the organic/inorganic hybrid film.

Thus, the dielectric constant of the first, second, third or fourth interlayer dielectric film can be lowered.

The fifth interlayer dielectric film of the invention comprises a plurality of first sites of siloxane and a plurality of second sites of an organic molecule, and the plurality of second sites together form an organic polymer film and the plurality of first sites are dispersed in the organic polymer film.

In the fifth interlayer dielectric film, the first site of siloxane may or may not be bonded to the second site of an organic molecule.

In the fifth interlayer dielectric film, the first sites of siloxane are dispersed in the organic polymer film made from the organic molecules. Therefore, copper interconnects disposed with the interlayer dielectric film sandwiched therebetween are never electrically connected to each other through the first sites of siloxane. Accordingly, copper ions drifting from the copper interconnects into the interlayer dielectric film are easily trapped by the first sites of siloxane, and hence the copper ions are minimally diffused into the interlayer dielectric film. As a result, the breakdown voltage of the fifth interlayer dielectric film is minimally lowered even when used for a long period of time.

In the fifth interlayer dielectric film, a largest distance between the plurality of first sites is preferably smaller than a distance between a pair of copper interconnects disposed with the organic polymer film sandwiched therebetween.

Thus, the copper interconnects adjacent to each other with the interlayer dielectric film sandwiched therebetween can be definitely prevented from being electrically connected through the first sites of siloxane. Therefore, copper ions drifting from one of the adjacent copper interconnects into the interlayer dielectric film minimally pass by the vicinity of the first sites of siloxane to reach the other copper interconnect. Accordingly, the copper ions drifting from one copper interconnect can be prevented from reaching the other copper interconnect, and hence, the copper interconnects can be prevented from being electrically connected to each other through the copper ions.

In the fifth interlayer dielectric film, pores are preferably dispersed in the organic polymer film.

Thus, the dielectric constant of the fifth interlayer dielectric film can be lowered.

In any of the first through fifth interlayer dielectric films, the first site is preferably represented by the following general formula (1):

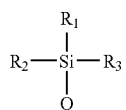

(1)

wherein $R_1$, $R_2$ and $R_3$ are an oxygen atom or an organic group.

Thus, the copper ions can be definitely prevented from passing by the vicinity of the first sites of siloxane to diffuse into the interlayer dielectric film.

Alternatively, in any of the first through fifth interlayer dielectric films, the first site is preferably represented by the following general formula (2):

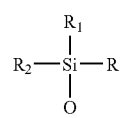

(2)

wherein R is an organic group; and $R_1$ and $R_2$ are an oxygen atom or an organic group, which is selected from the group consisting of an alkyl group, an alyl group and an aryl group.

Thus, the copper ions can be definitely prevented from passing by the vicinity of the first sites of siloxane to diffuse into the interlayer dielectric film.

In any of the first through fifth interlayer dielectric films, the second site is preferably polyimide, polyamide, polyimidazole, polyoxazole, polyphenylene, polyarylene, polyaryl ether, polyalkane or a fluorinated polymer of any of these polymers.

The sixth interlayer dielectric film of the invention comprises a multi-layer film, in which a first layer of siloxane and a second layer of an organic molecule are alternately stacked on each other.

In the sixth interlayer dielectric film, a lower copper interconnect and an upper copper interconnect disposed below and on the interlayer dielectric film are never connected to each other through the first layer of siloxane or the second layer of the organic molecule. Therefore, copper ions drifting from the lower or upper copper interconnect into the interlayer dielectric film are easily trapped by siloxane included in the first layer. Accordingly, the copper ions are minimally diffused into the interlayer dielectric film, and hence, the lower copper interconnect and the upper copper interconnect can be prevented from being electrically connected to each other through the copper ions.

DETAILED DESCRIPTION OF THE INVENTION

Embodiment 1

An interlayer dielectric film and a method for forming the same according to Embodiment 1 of the invention will now be described with reference to the accompanying drawings.

Figure 1:
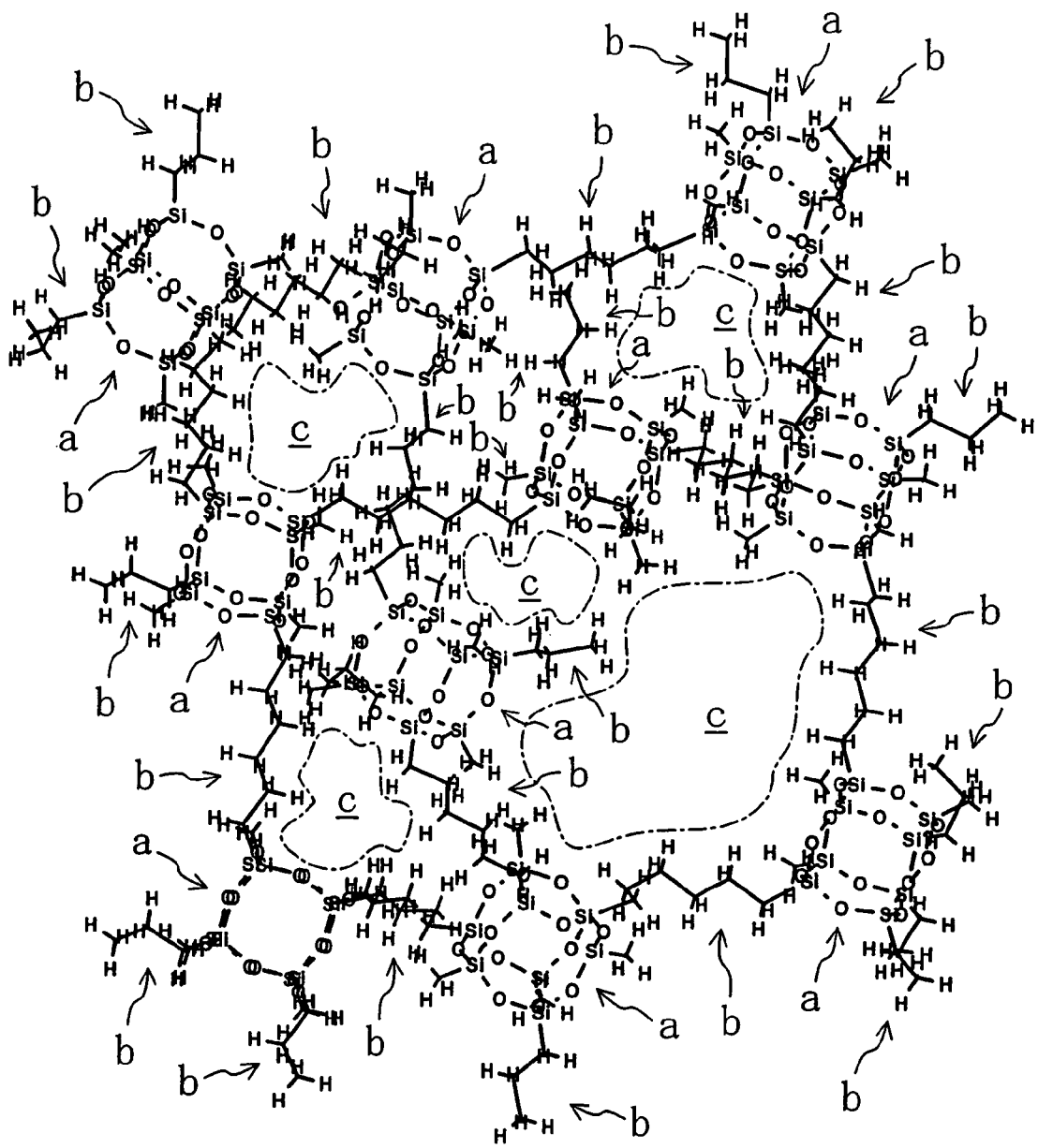
FIG. 1 is a diagram for showing the molecular structure of an organic/inorganic hybrid film corresponding to an interlayer dielectric film according to Embodiment 1 of the invention.

FIG. 1 shows the molecular structure of an organic/inorganic hybrid film corresponding to the interlayer dielectric film of Embodiment 1. In FIG. 1, a indicates a first site composed of siloxane, b indicates a second site composed of an organic molecule and c indicates a free volume.

Figure 2:
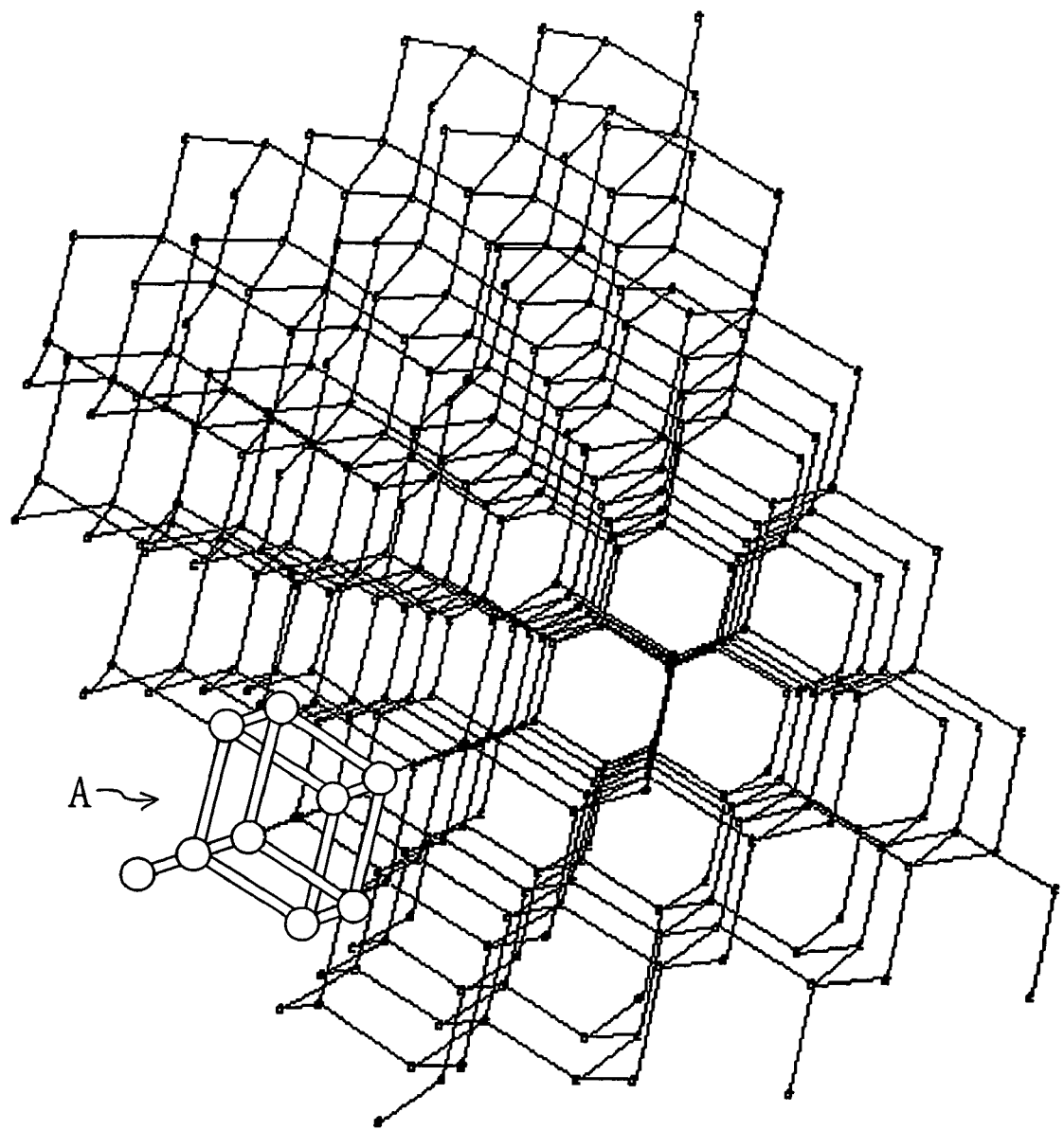
FIG. 2 is a conceptual diagram for showing the molecular structure of the organic/inorganic hybrid film corresponding to the interlayer dielectric film of Embodiment 1.

FIG. 2 is a conceptual diagram for showing the molecular structure of the organic/inorganic hybrid film corresponding to the interlayer dielectric film of Embodiment 1.

Figure 3:
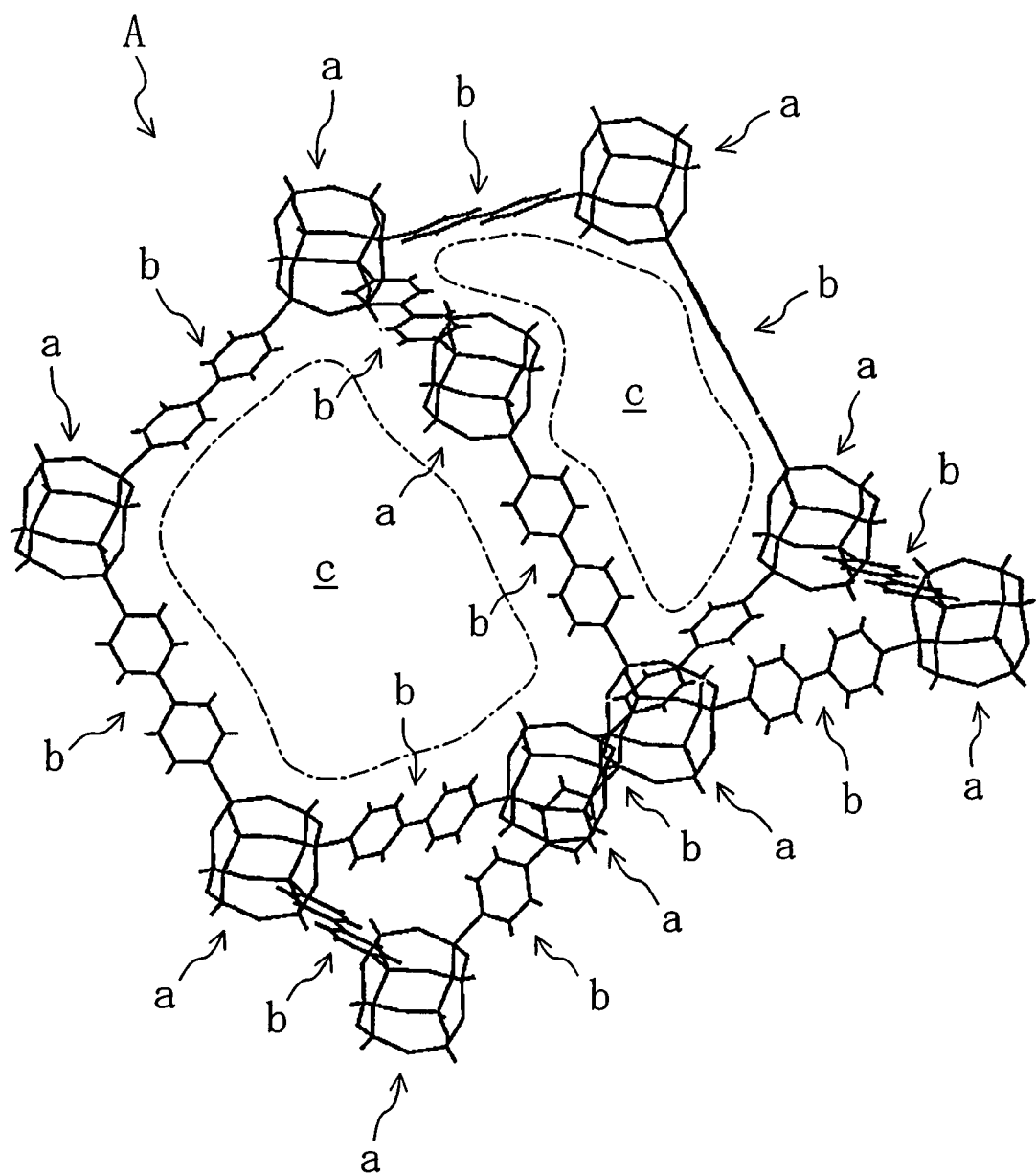
FIG. 3 is a diagram for roughly showing the molecular structure of a region A of FIG. 2.

FIG. 3 roughly shows the molecular structure of a region A of FIG. 2, wherein a indicates the first site composed of siloxane, b indicates the second site composed of the organic molecule and c indicates the free volume.

Figure 4:
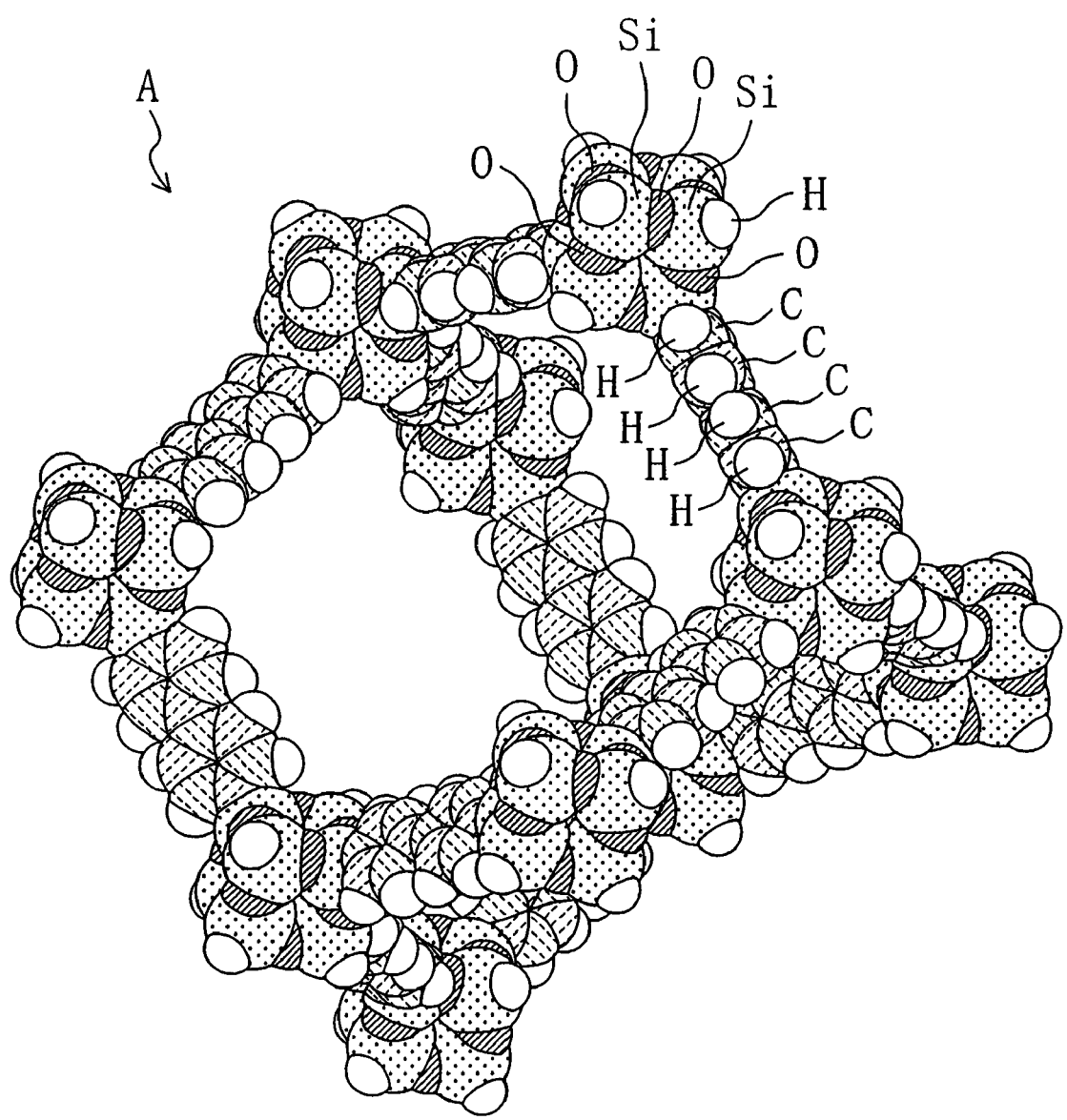
FIG. 4 is a schematic diagram for showing the molecular structure of the region A of FIG. 2.

FIG. 4 schematically shows the molecular structure of the region A of FIG. 2.

Figure 5:
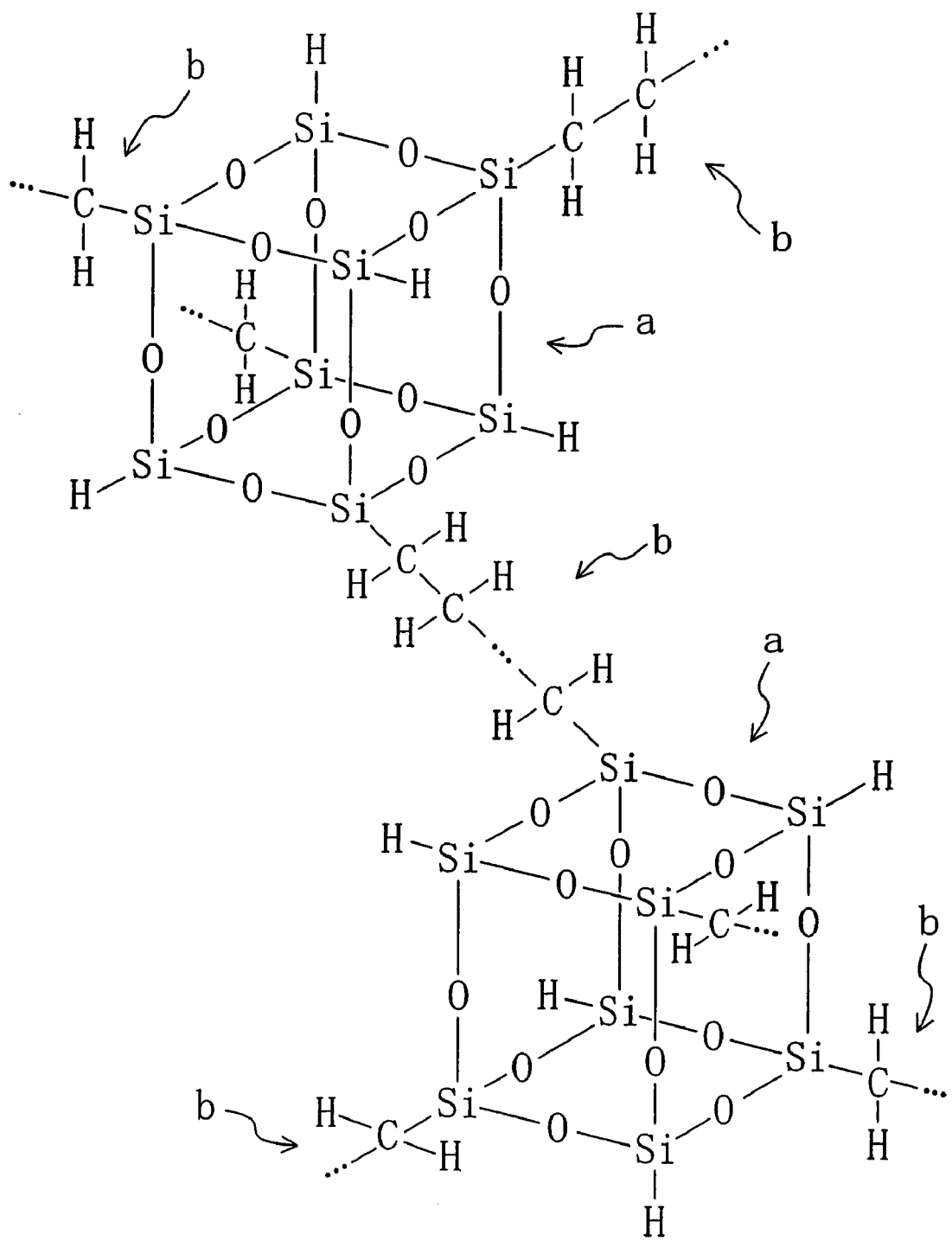
FIG. 5 is a diagram for three-dimensionally showing a bond between a first site composed of siloxane and a second site composed of an organic molecule in the organic/inorganic hybrid film of Embodiment 1.

FIG. 5 three-dimensionally shows a bond between the first site a composed of siloxane and the second site b composed of the organic molecule in the organic/inorganic hybrid film of Embodiment 1.

Figure 6:
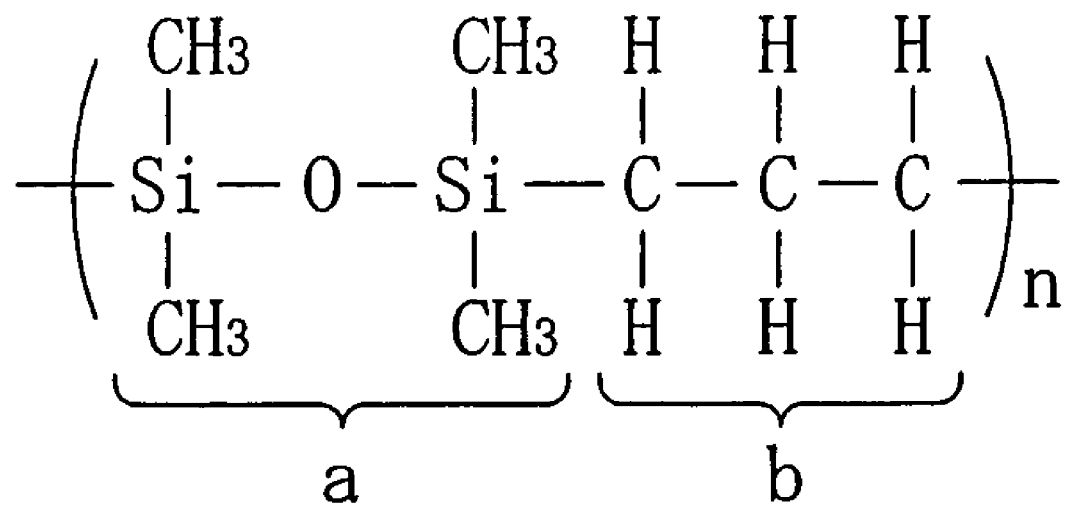
FIG. 6 is a diagram for two-dimensionally showing the bond between the first site composed of siloxane and the second site composed of the organic molecule in the organic/inorganic hybrid film of Embodiment 1.

FIG. 6 two-dimensionally shows the bond between the first site a composed of siloxane and the second site b composed of the organic molecule in the organic/inorganic hybrid film of Embodiment 1.

As shown in FIGS. 1, 3, 5 and 6, the organic/inorganic hybrid film of Embodiment 1 includes a plurality of first site a each composed of siloxane, a plurality of second sites b each composed of the organic molecule and a plurality of third sites c disposed dispersedly.

As a first characteristic of the organic/inorganic hybrid film of Embodiment 1, the first sites a each composed of siloxane and the second sites b each composed of the organic molecule together forming a main chain are alternately bonded to each other. As a second characteristic, the first site a is bonded to the second site b alone and the second site b is bonded to the first site a alone. As a third characteristic, each of the first sites a is surrounded with the plural second sites b. As a fourth characteristic, each of the second sites b is surrounded with the plural first sites a.

Although the first sites a and the second sites b are alternately bonded to each other in FIGS. 1, 3, 5 and 6, the first sites a and the second sites b may not be bonded to each other. In other words, the organic/inorganic hybrid film of Embodiment 1 may have the third or fourth characteristic without having the first and second characteristics.

Figure 7A:
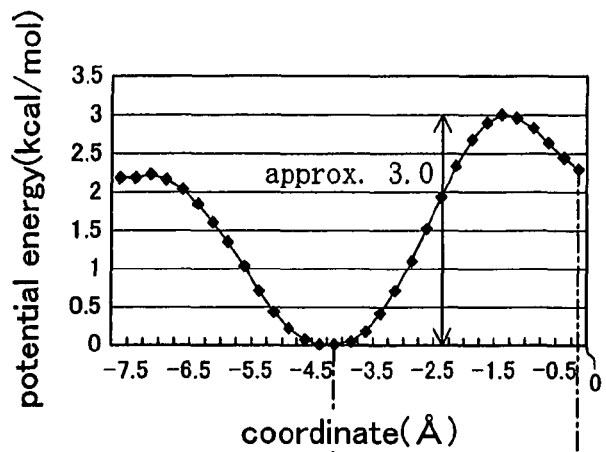
FIG. 7(a) is a characteristic diagram for showing the relationship between a coordinate axis corresponding to a distance from the center of the main chain of a polymer included in the organic/inorganic hybrid film of Embodiment 1 and the potential energy required for movement of a copper ion and FIG. 7(b) is a schematic diagram of the main chain of the polymer of the organic/inorganic hybrid film of Embodiment 1.
Figure 7B:
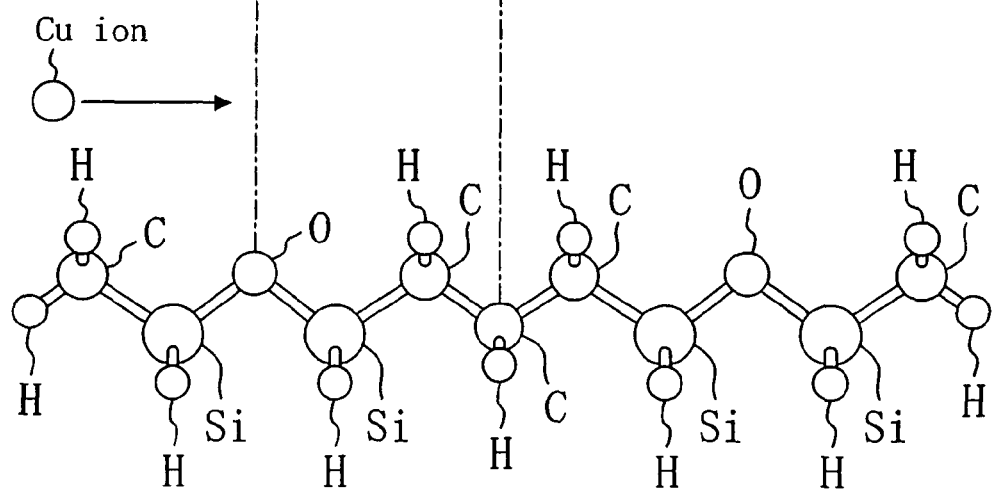

FIG. 7(a) shows the relationship between the coordinate axis (x-axis) corresponding to a distance from the center of the main chain of a polymer included in the organic/inorganic hybrid film of Embodiment 1 and the potential energy required for a copper ion to move along the main chain. FIG. 7(b) is a schematic diagram of the main chain of the polymer included in the organic/inorganic hybrid film of Embodiment 1. As is understood from FIGS. 7(a) and 7(b), the potential energy required for a copper ion to move from the vicinity of an oxygen atom (O) of siloxane (i.e., the first site a) to the vicinity of a carbon atom (C) of the organic molecule (i.e., the second site b) is very high and is specifically approximately 3 kcal/mol. In other words, a barrier to be cleared by the copper ion in moving from the first site a to the second site b is very high. Therefore, the copper ion drifting in the organic/inorganic hybrid film is easily trapped by the first site a.

Figure 8A:
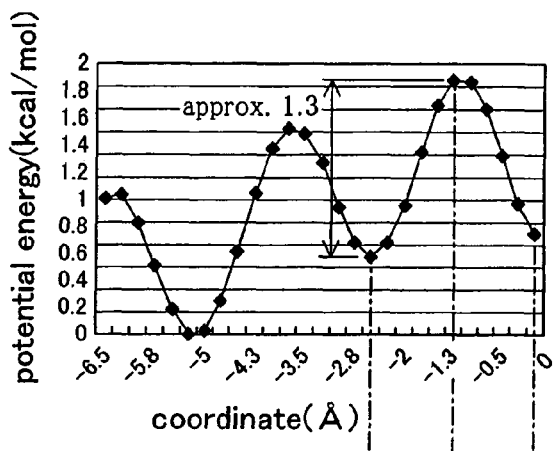
FIG. 8(a) is a characteristic diagram for showing the relationship between a coordinate axis corresponding to a distance from the center of the main chain of a polymer included in a conventional organic polymer film and the potential energy required for movement of a copper ion and FIG. 8(b) is a schematic diagram of the main chain of the polymer of the conventional organic polymer film.
Figure 8B:
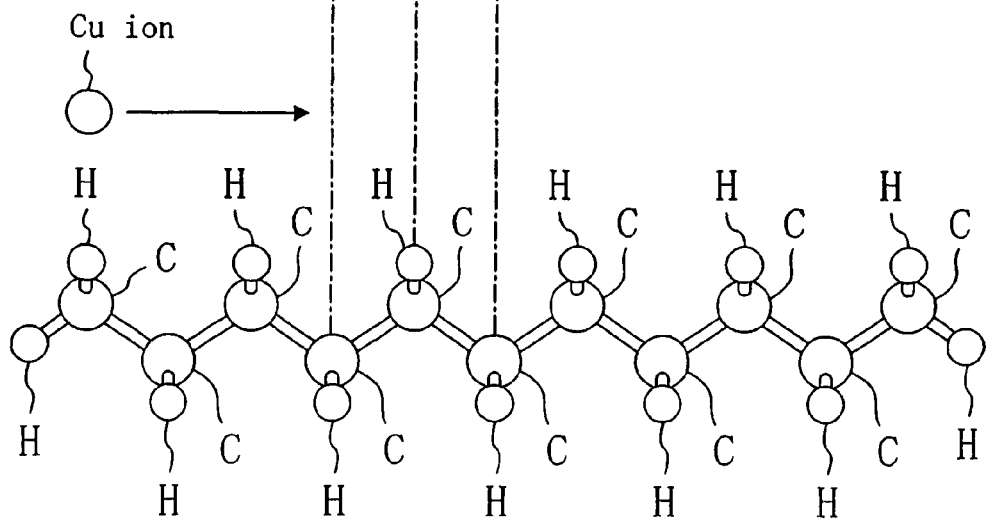

FIG. 8(a) shows the relationship between the coordinate axis (x-axis) corresponding to a distance from the center of the main chain of a polymer included in a conventional organic polymer film and the potential energy required for a copper ion to move along the main chain. FIG. 8(b) is a schematic diagram of the main chain of the polymer included in the organic polymer film. As is understood from FIGS. 8(a) and 8(b), the potential energy required for a copper ion to move from the vicinity of one carbon atom (C) included in the organic polymer to the vicinity of another carbon atom (C) is low and is specifically approximately 1.3 kcal/mol. Therefore, the copper ion drifting in the organic polymer film is minimally trapped.

Figure 9A:
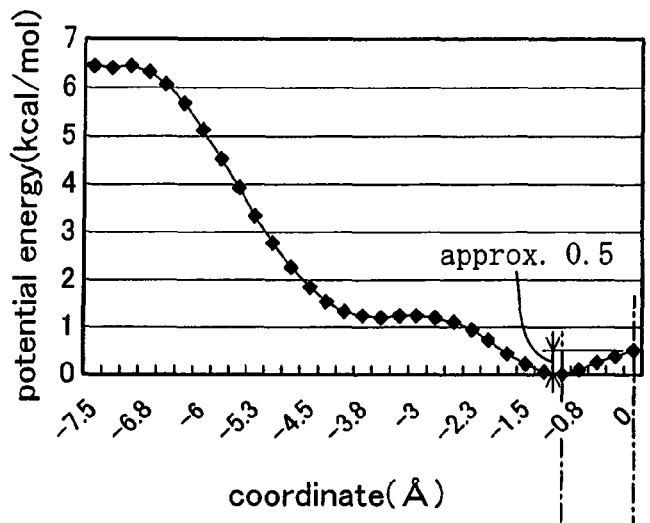
FIG. 9(a) is a characteristic diagram for showing the relationship between a coordinate axis corresponding to a distance from the center of the main chain of a polymer included in a conventional ladder type siloxane film and the potential energy required for movement of a copper ion and FIG. 9(b) is a schematic diagram of the main chain of the polymer of the conventional ladder type siloxane film.
Figure 9B:
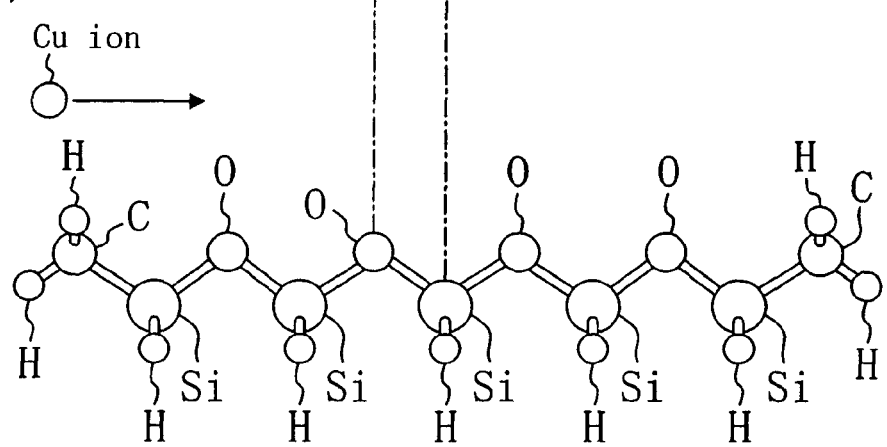

FIG. 9(a) shows the relationship between the coordinate axis (x-axis) corresponding to a distance from the center of the main chain of a polymer included in a conventional ladder type siloxane film and the potential energy required for a copper ion to move along the main chain. FIG. 9(b) is a schematic diagram of the main chain of the polymer included in the ladder type siloxane film. As is understood from FIGS. 9(a) and 9(b), the potential energy required for a copper ion to move from the vicinity of an oxygen atom (O) of siloxane to the vicinity of silicon (Si) is low and is specifically approximately 0.5 kcal/mol. Therefore, the copper ion drifting in the ladder type siloxane film is minimally trapped.

In FIG. 9(b), when a hydrogen atom bonded to a Si atom is replaced with an organic group, the film is an organic siloxane film. Also in the organic siloxane film, the potential energy required for a copper ion to move from the vicinity of an oxygen atom (O) of siloxane to the vicinity of silicon (Si) is the same as that shown in FIG. 9(b). Therefore, the copper ion drifting in the organic siloxane film is minimally trapped.

Figure 10:
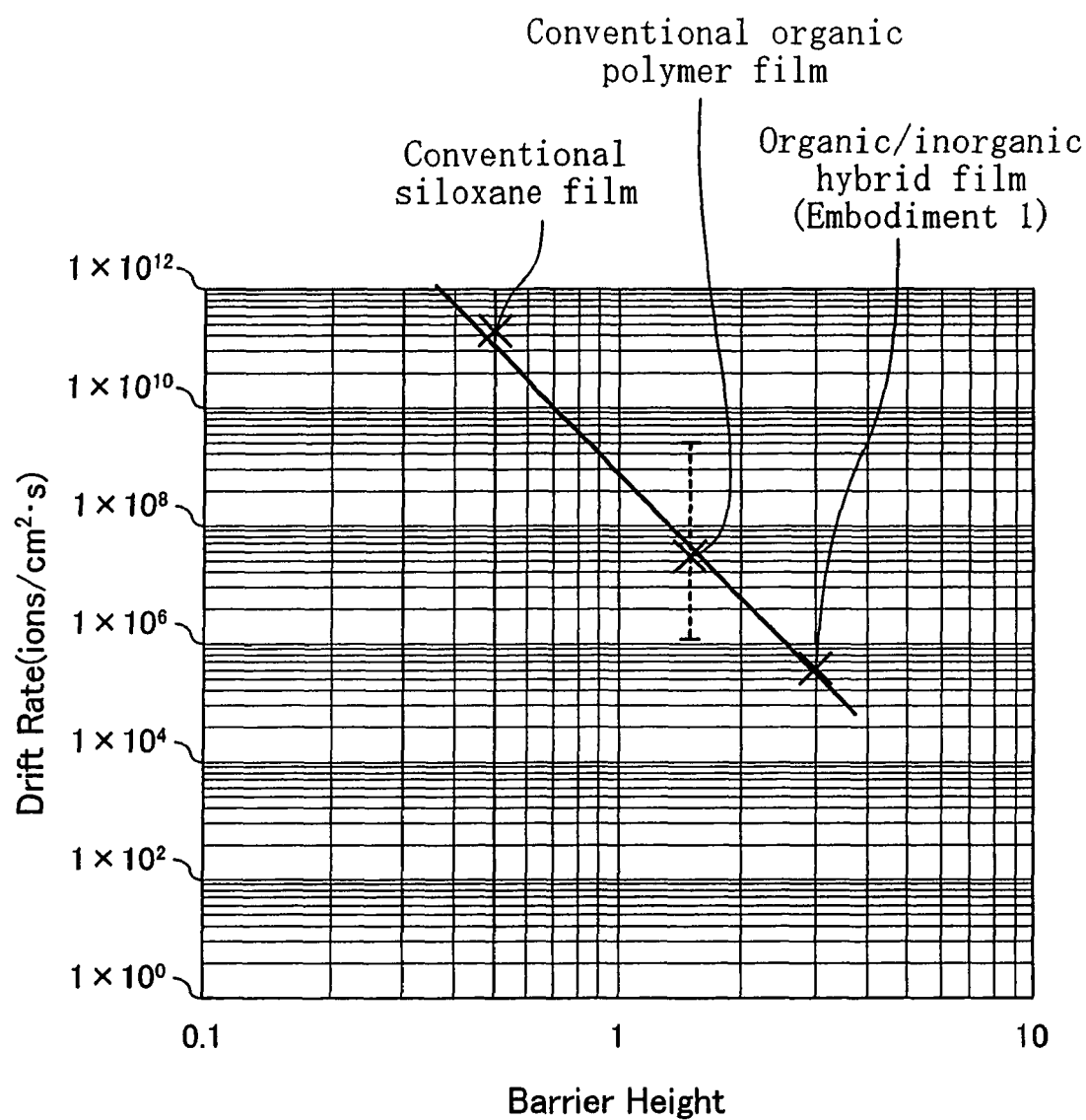
FIG. 10 is a characteristic diagram for showing the height of a barrier and the drift rate of copper ions in the organic/inorganic hybrid film of Embodiment 1, the conventional organic polymer film and the conventional siloxane film.

FIG. 10 shows the barrier height and the drift rate of copper ions in the organic/inorganic hybrid film of Embodiment 1 shown in FIG. 7(b), the conventional organic polymer film shown in FIG. 8(b) and the conventional siloxane film shown in FIG. 9(b). In the organic polymer film, the data obtained in the experiment are varied. As is understood from FIG. 10, the barrier height for copper ions is large and the drift rate is low in the organic/inorganic hybrid film of Embodiment 1.

As is understood from the above description, the potential energy required for, namely, the barrier height to be cleared by, a copper ion moving along the main chain of the polymer included in the organic/inorganic hybrid film of Embodiment 1 is much higher than the potential energy required for, namely, the barrier height to be cleared by, a copper ion moving along the main chain of the organic polymer or the ladder type siloxane. Therefore, the copper ions are easily trapped and difficult to drift in the organic/inorganic hybrid film of Embodiment 1. Accordingly, copper (copper ions) used as the material for interconnects is minimally diffused into the interlayer dielectric film of Embodiment 1. As a result, the breakdown voltage of the interlayer dielectric film is minimally lowered even when used for a long period of time.

Now, a method for forming the organic/inorganic hybrid film of Embodiment 1 will be described with reference to FIGS. 11(a) through 11(c).

Figure 11A:
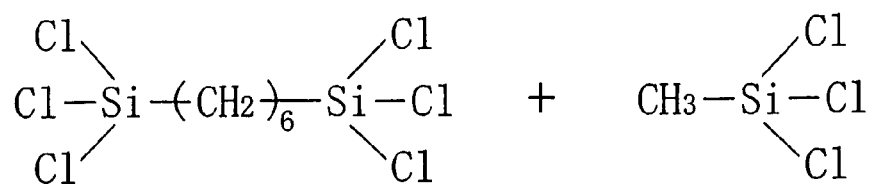
FIGS. 11(a), 11(b) and 11(c) are diagrams for showing chemical reactions occurring in forming the organic/inorganic hybrid film of Embodiment 1.
Figure 11B:
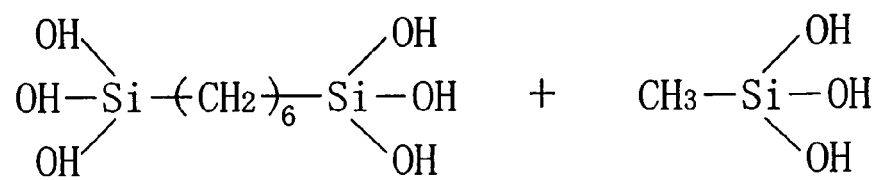

First, 1,6-(bistrichlorosilyl)hexane (a trichlorosilane derivative; a first silane derivative) shown on the left hand side of FIG. 11(a) and methyltrichlorosilane (a second silane derivate) shown on the right hand side of FIG. 11(a) are hydrolyzed in a ratio of 1:1 in an alcohol solution, so as to obtain two silanols as shown in FIG. 11(b).

Figure 11C:
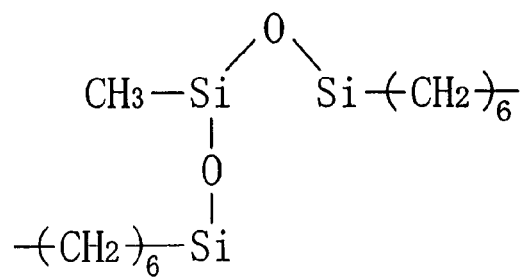

Next, the two silanols are polymerized through a dehydration condensation reaction, so as to give a silanol condensate as shown in FIG. 11(c).

Then, a solution including the silanol condensate of FIG. 11(c) is applied on a semiconductor substrate by spin coating and the resultant substrate is annealed. In this manner, the interlayer dielectric film of the organic/inorganic hybrid film having the structure as shown in FIG. 1 in which methylsilsesquioxanes in a cage structure (i.e., the first sites a) are bonded via methylene of hexane (i.e., the second site b) in a network structure is formed.

Although the trichlorosilane derivative is used as the first silane derivative in the above-described method for forming the interlayer dielectric film of Embodiment 1, a trialkoxysilane derivative may be used instead.

Also, although the silane derivative in which silicon atoms are crosslinked via hexane including six methylene groups is used as the second silane derivative, the number of methylene groups is not specified. Also, an organic molecule other than the methylene groups, such as phenylene, may be used as the crosslinking molecule.

Furthermore, any siloxane represented by the following general formula (1) may be widely used as the first site a included in the organic/inorganic hybrid film of Embodiment 1:

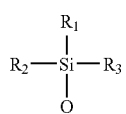

(1)

wherein $R_1$, $R_2$ and $R_3$ are an oxygen atom or an organic group.

Alternatively, any siloxane represented by the following general formula (2) may be widely used as the first site a included in the organic/inorganic hybrid film of Embodiment 1:

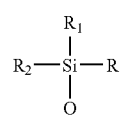

(2)

wherein R is an organic group; and $R_1$ and $R_2$ are an oxygen atom or an organic group, which is selected from the group consisting of an alkyl group, an alyl group and an aryl group.

Moreover, polyimide, polyamide, polyimidazole, polyoxazole, polyphenylene, polyarylene, polyaryl ether, polyalkane or a fluorinated polymer of any of these polymers may be widely used as the second site b included in the organic/inorganic hybrid film of Embodiment 1.

Embodiment 2

An interlayer dielectric film and a method for forming the same according to Embodiment 2 of the invention will now be described with reference to the accompanying drawing.

The interlayer dielectric film of Embodiment 2 includes a plurality of first sites a each composed of siloxane and a plurality of second sites b each composed of an organic molecule. The plural second sites b together form an organic polymer film, in which the plural first sites a and a plurality of holes c are dispersed. In this case, the first site a composed of siloxane may be or may not be bonded to the second site b composed of the organic molecule.

Figure 12:
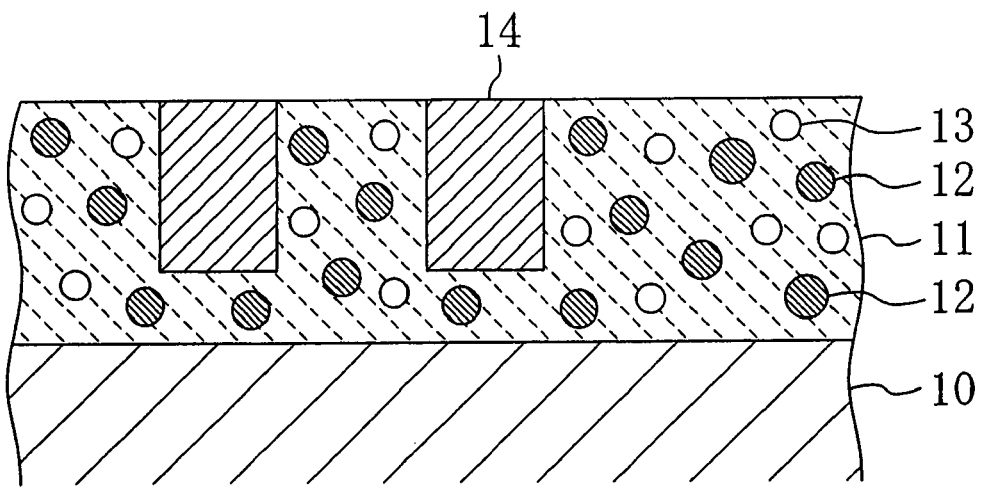
FIG. 12 is a cross-sectional view of an interlayer dielectric film according to Embodiment 2 of the invention.

FIG. 12 shows the cross-sectional structure of the interlayer dielectric film of Embodiment 2. As shown in FIG. 12, in the interlayer dielectric film formed on a semiconductor substrate 10, a plurality of silica fine particles 12 each corresponding to the first site a and a plurality of holes 13 are dispersed in an organic polymer film 11 formed from the plural second sites b.

Since the silica fine particles 12 of siloxane are dispersed in the organic polymer film 11 of the organic molecules in the interlayer dielectric film of Embodiment 2, copper interconnects 14 adjacent to each other are never connected through the silica fine particles 12 of siloxane. Therefore, copper ions drifting in the organic polymer film 11 from the copper interconnect 14 are trapped by the first sites a of siloxane and hence are minimally diffused into the organic polymer film 11. Accordingly, the copper interconnects 14 adjacent to each other can be prevented from being electrically connected through the copper ions.

In this case, the largest distance between the first sites a of siloxane forming the silica fine particles 12 is preferably smaller than the distance between the copper interconnects 14 adjacent to each other. Thus, the copper interconnects 14 adjacent to each other can be definitely prevented from being electrically connected through the first sites a of siloxane, and therefore, copper ions drifting in the organic polymer film 11 from one copper interconnect 14 can never pass by the vicinity of the first sites a of siloxane to reach the other adjacent copper interconnect 14. Accordingly, the copper ions drifting from one copper interconnect 14 can be prevented from reaching the other copper interconnect 14, and hence, the dielectric property of the interlayer dielectric film is never degraded.

Now, the method for forming the interlayer dielectric film of Embodiment 2 will be described.

Silica fine particles with an average particle size of 10 nm are dispersed in, for example, a polymer solution of the polyalyl ether family. Then, the solution in which the silica fine particles are dispersed is applied on a semiconductor substrate by spin coating, and the resultant semiconductor substrate is annealed. In this manner, the interlayer dielectric film as shown in FIG. 12 in which the plural silica fine particles 12 and the plural holes 13 are dispersed in the organic polymer film 11 formed from the plural second sites b can be obtained.

Although the polymer solution of the polyalyl ether family in which the silica fine particles are dispersed is used for forming the interlayer dielectric film in Embodiment 2, the interlayer dielectric film may be formed by using a solution including a silanol condensate obtained through hydrolysis and dehydration condensation of 1,6-(bistrichlorosilyl)hexane (first silane derivative) and methyltrichlorosilane as in Embodiment 1.

As the first site a included in the organic/inorganic hybrid film of Embodiment 2, any siloxane represented by the above-described general formula (1) or (2) may be widely used. As the second site b, polyimide, polyamide, polyimidazole, polyoxazole, polyphenylene, polyarylene, polyaryl ether, polyalkane or a fluorinated polymer of any of these polymers may be widely used.

Embodiment 3

An interlayer dielectric film according to Embodiment 3 of the invention will now be described with reference to the accompanying drawing.

Figure 13:
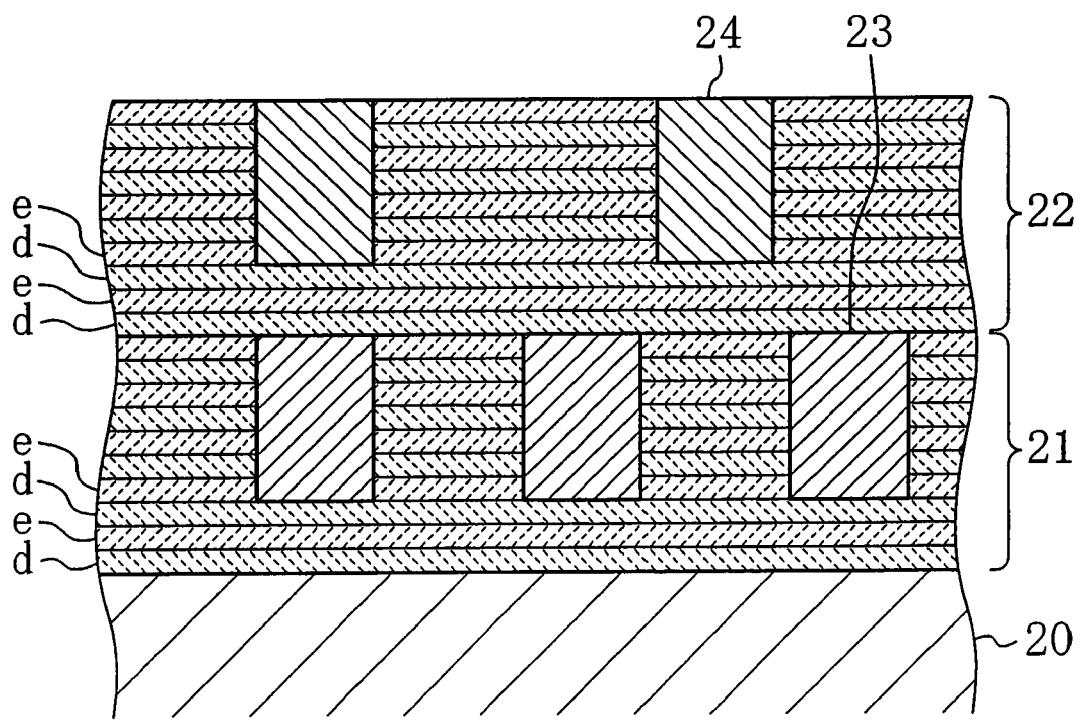
FIG. 13 is a cross-sectional view of an interlayer dielectric film according to Embodiment 3 of the invention.
Figure 14:
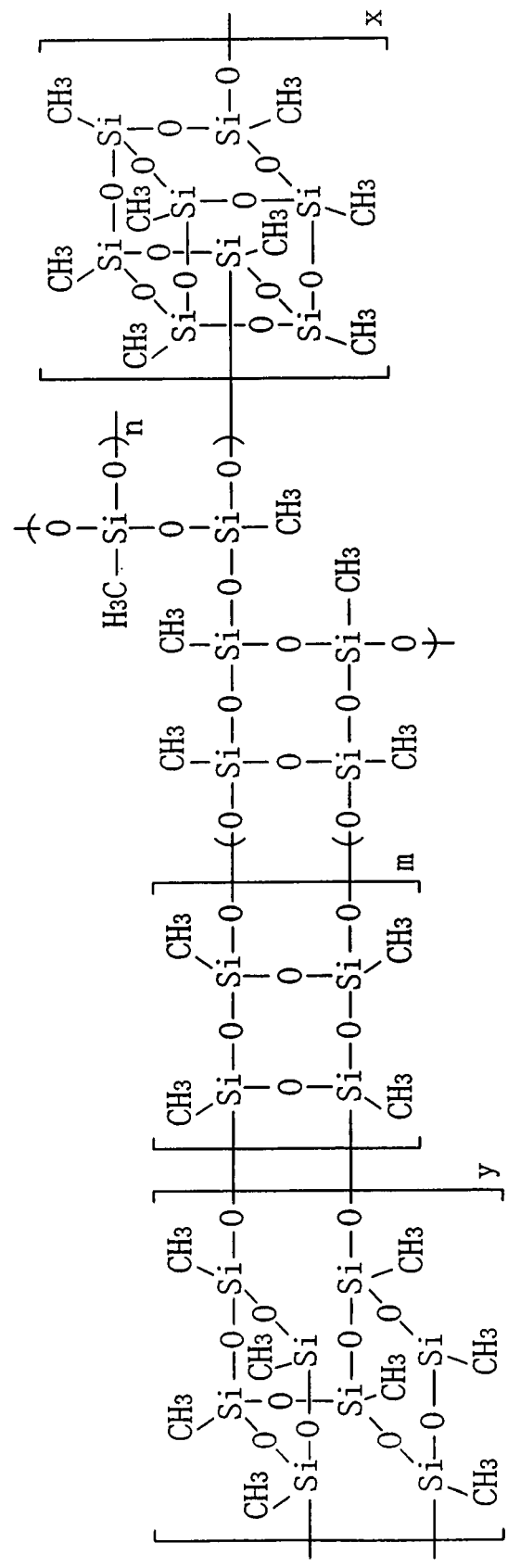
FIG. 14 is a diagram of general formula representing the chemical structure of conventional organic siloxane.

FIG. 13 shows the cross-sectional structure of the interlayer dielectric film of Embodiment 3. As shown in FIG. 13, a lower interlayer dielectric film 21 and an upper interlayer dielectric film 22 are successively formed on a semiconductor substrate 20. A lower copper interconnect 23 is buried in the lower interlayer dielectric film 21, and an upper copper interconnect 24 is buried in the upper interlayer dielectric film 22.

As shown in FIG. 13, each of the lower and upper interlayer dielectric films 21 and 22 is made from a multi-layer film composed of a first layer d of siloxane and a second layer e of an organic molecule alternately stacked.

Since the first layer d of siloxane and the second layer e of the organic molecule are alternately stacked in the interlayer dielectric film of Embodiment 3, the lower copper interconnect 23 and the upper copper interconnect 24 are never electrically connected to each other through the first layer d of siloxane and the second layer e of the organic molecule. Therefore, copper ions drifting from the lower or upper copper interconnect 23 or 24 into the upper interlayer dielectric film 22 are trapped by siloxane included in the first layer d and hence are minimally diffused into the upper interlayer dielectric film 22. Accordingly, the lower copper interconnect 23 and the upper copper interconnect 24 can be prevented from being electrically connected to each other through the copper ions.

What is claimed is:

1. An interlayer dielectric film having a plurality of metal interconnects disposed therein, said metal interconnects including a plurality of copper interconnects, at least two of which are adjacent to each other, the interlayer dielectric film further comprising an organic/inorganic hybrid film composed of a plurality of first sites of siloxane and a plurality of second sites of an organic molecule, wherein said plurality of first sites are separated from each other, each of said plurality of first sites being bonded to at least one of said second sites, said organic/inorganic hybrid film has a three-dimensional main chain composed of said first sites and said second sites, and in said three-dimensional main chain, said first sites are bonded to each other with said second sites interposed therebetween, the largest distance between the first sites of siloxane is smaller than the distance between the copper interconnects adjacent to each other, wherein each of said plurality of first sites is represented by the following general formula (1):

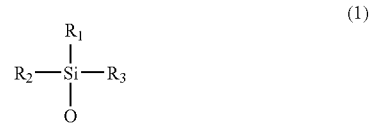

wherein $R_1$, $R_2$ and $R_3$ are an oxygen atom or an organic group, and wherein each of said plurality of second sites is polyimide, polyamide, polyimidazole, polyoxazole, polyphenylene, polyarylene, polyaryl ether, polyalkane or a fluorinated polymer of any of these polymers.

2. The interlayer dielectric film of claim 1,
wherein pores are dispersed in said organic/inorganic hybrid film.

3. The interlayer dielectric film of claim 1,
wherein each of said plurality of first sites is represented by the following general formula (2):

wherein R is an organic group; and $R_1$ and $R_2$ are an organic group, which is selected from the group consisting of an alkyl group, an alyl group and an aryl group.

4. The interlayer dielectric film of claim 1, wherein the plurality of first sites are separated into groups by at least one of the plurality of second sites, each group having one or more of said plurality of first sites, and each of the plurality of first sites is bonded to at least one of the plurality of second sites adjacent to the each first site.

5. The interlayer dielectric film of claim 1, wherein each of said plurality of second sites is polyimide, polyimidazole, polyoxazole, polyphenylene, polyarylene, polyaryl ether, polyalkene or a fluorinated polymer of any of these polymers.

6. The interlayer dielectric film of claim 1, wherein said organic/inorganic hybrid film forms at least one caged structure.

7. An interlayer dielectric film having a plurality of metal interconnects disposed therein, said metal interconnects including a plurality of copper interconnects, at least two of which are adjacent to each other, the interlayer dielectric film further comprising an organic/inorganic hybrid film having free volumes and a three-dimensional main chain, the three-dimensional main chain being composed of a plurality of first sites of siloxane and a plurality of second sites of an organic molecule, wherein in said three-dimensional main chain, said first sites are bonded to each other with said second sites interposed therebetween, and said plurality of first sites are separated from each other and have free volumes, and wherein the largest distance between the first sites of siloxane is smaller than the distance between the copper interconnects adjacent to each other, wherein each of said plurality of first sites is represented by the following general formula (1):

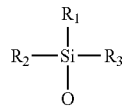
(1)

wherein $R_1$, $R_2$ and $R_3$ are an oxygen atom or an organic group, and wherein each of said plurality of second sites is polyimide, polyamide, polyimidazole, polyoxazole polyphenylene, polyarylene, polyaryl ether, polyalkane or a fluorinated polymer of any of these polymers.

8. The interlayer dielectric film of claim 7, wherein each of said plurality of second sites is a polyamide, polyimidazole, polyoxazole, polyphenylene, polyarylene, polyaryl ether, polyalkane or a fluorinated polymer of any of these polymers.

9. The interlayer dielectric film of claim 7, wherein each of said plurality of first sites is represented by the following general formula (3):

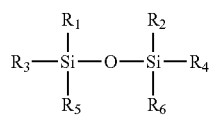
(3)

wherein $R_1$, $R_2$, $R_3$, $R_4$, $R_5$ and $R_6$ are an organic group.

10. The interlayer dielectric film of claim 7, wherein the plurality of first sites are separated into groups by at least one of the plurality of second sites, each group having one or more of said plurality of first sites, and each of the plurality of first sites is bonded to at least one of the plurality of second sites adjacent to the each first site.

11. An interlayer dielectric film having a plurality of metal interconnects disposed therein, said metal interconnects including a plurality of copper interconnects, at least two of which are adjacent to each other, the interlayer dielectric film further comprising an organic/inorganic hybrid film composed of a plurality of first sites of siloxane and a plurality of second sites of an organic molecule, wherein said first sites are bonded to said second sites alone and said second sites are bonded to said first sites alone, said plurality of first sites are separated from each other and have free volumes said organic/inorganic hybrid film has a three-dimensional main chain composed of said first sites and said second sites, and in said three-dimensional main chain, said first sites are bonded to each other with said second sites interposed therebetween, wherein the largest distance between the first sites of siloxane is smaller than the distance between the copper interconnects adjacent to each other, wherein each of said plurality of first sites is represented by the following general formula (1):

(1)

wherein $R_1$, $R_2$ and $R_3$ are an oxygen atom or an organic group, and wherein each of said plurality of second sites is polyimide, polyamide, polyimidazole, polyoxazole, polyphenylene, polyarylene, polyaryl ether, polyalkane or a fluorinated polymer of any of these polymers.

12. The interlayer dielectric film of claim 11, wherein each of said plurality of second sites is a polyamide, polyimidazole, polyoxazole, polyphenylene, polyarylene, polyaryl ether, polyalkane or a fluorinated polymer of any of these polymers.

13. The interlayer dielectric film of claim 11, wherein the plurality of first sites are separated into groups by at least one of the plurality of second sites and free volumes, each group having one or more of said plurality of first sites.

14. An interlayer dielectric film having a plurality of metal interconnects disposed therein, said metal interconnects including a plurality of copper interconnects, at least two of which are adjacent to each other, the interlayer dielectric film further comprising an organic/inorganic hybrid film composed of a plurality of first sites of siloxane and a plurality of second sites of an organic molecule, wherein each of said plurality of second sites is a polyamide, polyimidazole, polyoxazole, polyphenylene, polyarylene, polyaryl ether, polyalkane or a fluorinated polymer of any of these polymers, said organic/inorganic hybrid film has a three dimensional main chain composed of said first sites and said second sites, in said three-dimensional main chain, said first sites are bonded to each other with said second sites interposed therebetween, and wherein the largest distance between the first sites of siloxane is smaller than the distance between the copper interconnects adjacent to each other, wherein each of said plurality of first sites is represented by the following general formula (1):

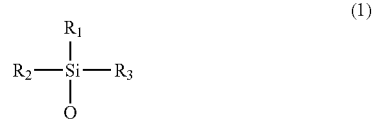
(1)

wherein $R_1$, $R_2$ and $R_3$ are an oxygen atom or an organic group, and wherein each of said plurality of second sites is polyimide, polyamide, polyimidazole, polyoxazole, polyphenylene, polyarylene, polyaryl ether, polyalkane or a fluorinated polymer of any of these polymers.

15. The interlayer dielectric film of claim 14, wherein the plurality of first sites are separated into groups by at least one of the plurality of second sites, each group having one or more of said plurality of first sites.

16. An interlayer dielectric film having a plurality of metal interconnects disposed therein, said metal interconnects including a plurality of copper interconnects, at least two of which are adjacent to each other, the interlayer dielectric film further comprising an organic/inorganic hybrid film composed of a plurality of first sites of siloxane and a plurality of second sites of an organic molecule,
- wherein said plurality of first sites are separated from each other, each of said plurality of first sites being bonded to at least one of said second sites,
- said organic/inorganic hybrid film has a three-dimensional main chain composed of said first sites and said second sites, and
- in said three-dimensional main chain, said first sites are bonded to each other with said second sites interposed therebetween,
- the largest distance between the first sites of siloxane is smaller than the distance between the copper interconnects adjacent to each other, and
- the film is a silanol condensate obtained through hydrolysis and dehydration condensation of 1,6-(bistrichlorosilyl)hexane and methyltrichlorosilane.

* * * * *